United States Patent [19]
Lewis et al.

[11] Patent Number: 5,891,311
[45] Date of Patent: Apr. 6, 1999

[54] SPUTTER COATING SYSTEM AND METHOD USING SUBSTRATE ELECTRODE

[75] Inventors: William A. Lewis, San Francisco; Steven Aragon, Campbell, both of Calif.

[73] Assignee: Intevac, Inc., Santa Clara, Calif.

[21] Appl. No.: 881,048

[22] Filed: Jun. 25, 1997

[51] Int. Cl.[6] .................................................. C23C 14/34
[52] U.S. Cl. .................................. 204/192.12; 204/192.2; 204/298.06; 204/298.11; 204/298.14; 204/298.15; 204/298.26; 204/298.19
[58] Field of Search .......................... 204/192.12, 192.2, 204/298.06, 298.08, 298.11, 298.14, 298.15, 298.26, 298.19

[56] References Cited

U.S. PATENT DOCUMENTS

| | | | |
|---|---|---|---|
| 4,183,797 | 1/1980 | Kennedy et al. | 204/192.08 |
| 4,595,481 | 6/1986 | Allen et al. | 204/298.15 |
| 4,997,539 | 3/1991 | Komizo et al. | 204/298.06 |
| 5,688,381 | 11/1997 | Gruenenfelder et al. | 204/298.11 |

FOREIGN PATENT DOCUMENTS

| | | | |
|---|---|---|---|
| 3-283111 | 12/1991 | Japan | 204/192.2 |

OTHER PUBLICATIONS

Amudsen et al., "Improving Uniformity of Sputtered Magnetic Films", IBM Technical Disclosure Bulletin, vol. 12, No. 11, p. 1809, Apr. 1970.

*Primary Examiner*—Nam Nguyen
*Assistant Examiner*—Rodney G. McDonald
*Attorney, Agent, or Firm*—Stanley Z. Cole

[57] ABSTRACT

Apparatus for depositing a film on a substrate includes a housing that encloses a sputtering chamber, a substrate holder for positioning a substrate in the sputtering chamber and a sputtering gun, including a sputtering target, for depositing a film of atoms of the target on a surface of the substrate. The chamber contains a gas which forms a plasma. An electrical potential is applied to the substrate for accelerating ions from the plasma toward the substrate. The apparatus includes a substrate electrode for controlling trajectories of ions accelerated from the plasma toward the substrate. The substrate electrode permits movement of the substrate by the substrate holder and establishes a substantially uniform electrical potential around the periphery of the substrate as viewed from the plasma. The substrate electrode may be biased so that ions substantially uniformly bombard the surface of the substrate.

15 Claims, 4 Drawing Sheets

SPUTTER COATING SYSTEM AND METHOD USING SUBSTRATE ELECTRODE

FIELD OF THE INVENTION

This invention relates to plasma processing of substrates and, more particularly, to sputtering methods and apparatus which utilize a substrate electrode to establish a substantially uniform electrical potential around the periphery of the substrate as viewed from the plasma in the sputtering chamber, so that ions substantially uniformly bombard the surface of the substrate.

BACKGROUND OF THE INVENTION

Sputter deposition, also known as sputter coating, is a technique for depositing thin films of a desired material on a substrate such as, for example, a magnetic disk for a hard disk drive or a semiconductor wafer. In general, ions of an inert gas from a plasma are accelerated toward a target of the material to be deposited. Free atoms of the target material are expelled when the ions collide with the target. A portion of the free atoms are collected on the surface of the substrate and form a thin film.

One well-known sputtering technique is magnetron sputtering. Magnetron sputtering uses a magnetic field to enhance the sputtering yield. Magnets are positioned behind the target, and magnetic field lines penetrate the target and form arcs over its surface. The magnetic field helps to confine electrons in an area near the surface of the target. The resulting increased concentration of electrons produces a high density of ions and enhances the efficiency of the sputtering process.

In a typical disk sputtering system, a disk is placed between two sputter sources, and thin films are deposited on both surfaces of the disk simultaneously. An example of a sputtering system of this type is the Model MDP-250B, manufactured and sold by Intevac, Inc. Another type of two-sided sputtering system is disclosed in U.S. Pat. No. 4,183,797 issued Jan. 15, 1980 to Kennedy et al.

A critical step in the manufacture of hard disk drive (HDD) media is the sputtering of thin films onto the media (disks). In order to achieve high recording densities, high coercivity and low noise media are required. It is also increasingly important that these properties remain uniform across the surface of the disk and from one disk to another. With the increased use of magneto-resistive heads, more stringent uniformity requirements are being placed on the media.

HDD media typically have several films, including underlayers, a magnetic recording layer and a protective overcoat layer. These thin films may all be deposited in the same sputtering system. Any of the layers can be deposited with the substrate at a bias potential using a technique commonly known as "biased sputtering". This technique differs from the basic sputtering process described above in that a voltage is applied to the disk. The voltage attracts to the disk ions which bombard the film that is being deposited and modify its properties.

Sputtering systems are usually designed for optimal film uniformity, target lifetime and collection of sputtered material (for increased cleanliness and reduced particle generation). Such design features are not always consistent with producing uniform films during biased sputtering, because the properties of the films produced using a bias on the disk also depend on the energy, angle and number of energetic ions bombarding the disk. These variables depend sensitively on the location and shape of electrodes within the system. In this context, electrodes are components of the sputtering system that have voltages applied to them, such as the target and the disk, or grounded conductors, such as chamber walls and shields.

Two sets of electrodes have primary influence on the properties of biased sputtered films. First, the disk is an electrode having a bias voltage that is virtually constant across its surface. This voltage drops immediately to zero, or to the voltage of the plasma in the chamber, beyond the edge of the disk. Since the disk attracts ions during biased sputtering, the shape of the disk and the applied voltage have a strong influence on the spatial distribution of the ions that bombard the disk. Typically, the voltage is applied to the disk through a substrate holder. Because the substrate holder is optimized for disk handling rather than for its impact on biased sputtering, it is usually non-uniform in shape. Non-uniform substrate holders induce localized electric field variations that produce images in the deposited materials (e.g., electrical, optical and mechanical images). This results in non-uniform biased sputtering. Second, the shields that are used to collect sputtered material and which serve as grounded surfaces for the gas discharge also influence the trajectories of the ions bombarding the disk. The shape of the shields may significantly alter the angles and the number of ions bombarding different locations on the disk. Thus, the shields may produce non-uniformities in the properties of the biased sputtered films.

Accordingly, there is a need for improved sputtering methods and apparatus wherein the above described non-uniformities are reduced or eliminated.

SUMMARY OF THE INVENTION

According to a first aspect of the invention, apparatus for depositing a film on a substrate is provided. The apparatus comprises a housing that encloses a sputtering chamber containing a working gas which forms a plasma, a substrate holder for positioning a substrate in the sputtering chamber and for applying to the substrate an electrical potential for accelerating ions from the plasma toward the substrate, and a sputtering gun, including a sputtering target, for depositing a film of atoms of the target on a surface of the substrate. The apparatus further comprises a substrate electrode for controlling trajectories of ions accelerated from the plasma toward the substrate. The substrate electrode permits movement of the substrate by the substrate holder and establishes a substantially uniform electrical potential around the periphery of the substrate as viewed from the plasma. The substrate electrode is preferably biased so that ions substantially uniformly bombard the surface of the substrate.

The substrate electrode preferably includes an aperture that is equal to or slightly larger than the substrate, so that the substrate is exposed to the target through the aperture. In a preferred embodiment, the substrate comprises a substantially circular disk, and the aperture in the substrate electrode is circular. The substrate electrode may be spaced from the substrate toward the target to permit movement of the substrate by the substrate holder. Preferably, the aperture in the substrate electrode has an inside wall that is tapered inwardly toward the substrate to provide a line-of-sight path between the target and the substrate.

The substrate electrode is preferably connected to a negative voltage source. In one embodiment, the substrate electrode and the substrate are connected to the same voltage source. In another embodiment, the substrate electrode and the substrate are connected to different voltage sources.

According to another aspect of the invention, apparatus for depositing a film on a substrate is provided. The apparatus comprises a sputtering chamber containing a gas which forms a plasma, a substrate holder for positioning a substrate in the sputtering chamber and for applying to the substrate an electrical potential for accelerating ions from the plasma toward the substrate, a first sputtering gun, including a first sputtering target in the chamber, for depositing a film of atoms of the first target on a first surface of the substrate and a second sputtering gun, including a second sputtering target in the chamber, for depositing a film of atoms of the second target on a second surface of the substrate. The apparatus further comprises a substrate electrode assembly for controlling trajectories of ions accelerated from the plasma toward the substrate. The substrate electrode assembly permits movement of the substrate by the substrate holder and establishes a substantially uniform potential around the periphery of the substrate as viewed from the plasma. The substrate electrode assembly may comprise a first substrate electrode disposed in proximity to the first surface of the substrate and a second substrate electrode disposed in proximity to the second surface of the substrate. The first and second substrate electrodes are preferably biased so that ions substantially uniformly bombard the first and second surfaces of the substrate.

According to a third aspect of the invention, apparatus for processing a substrate is provided. The apparatus comprises a chamber containing a gas which forms a plasma, a substrate holder for positioning a substrate in the chamber and for applying to the substrate an electrical potential for accelerating ions from the plasma toward a surface of the substrate and a substrate electrode for controlling trajectories of ions accelerated from the plasma toward the substrate. The substrate electrode permits movement of the substrate by the substrate holder and establishes a substantially uniform electrical potential around the periphery of the substrate. The substrate electrode is preferably biased so that ions substantially uniformly bombard the surface of the substrate.

According to a fourth aspect of the invention, a method for depositing a film on a substrate is provided. The method comprises the steps of positioning a substrate in a sputtering chamber containing a gas which forms a plasma, applying to the substrate an electrical potential for accelerating ions from the plasma toward the substrate depositing on a surface of the substrate a film of atoms of a target positioned in the sputtering chamber and controlling trajectories of ions accelerated from the plasma toward the substrate with a substrate electrode. The substrate electrode permits movement of the substrate and establishes a uniform electrical potential around the periphery of the substrate as viewed form the plasma. The substrate electrode is preferably biased so that ions substantially uniformly bombard the surface of the substrate.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
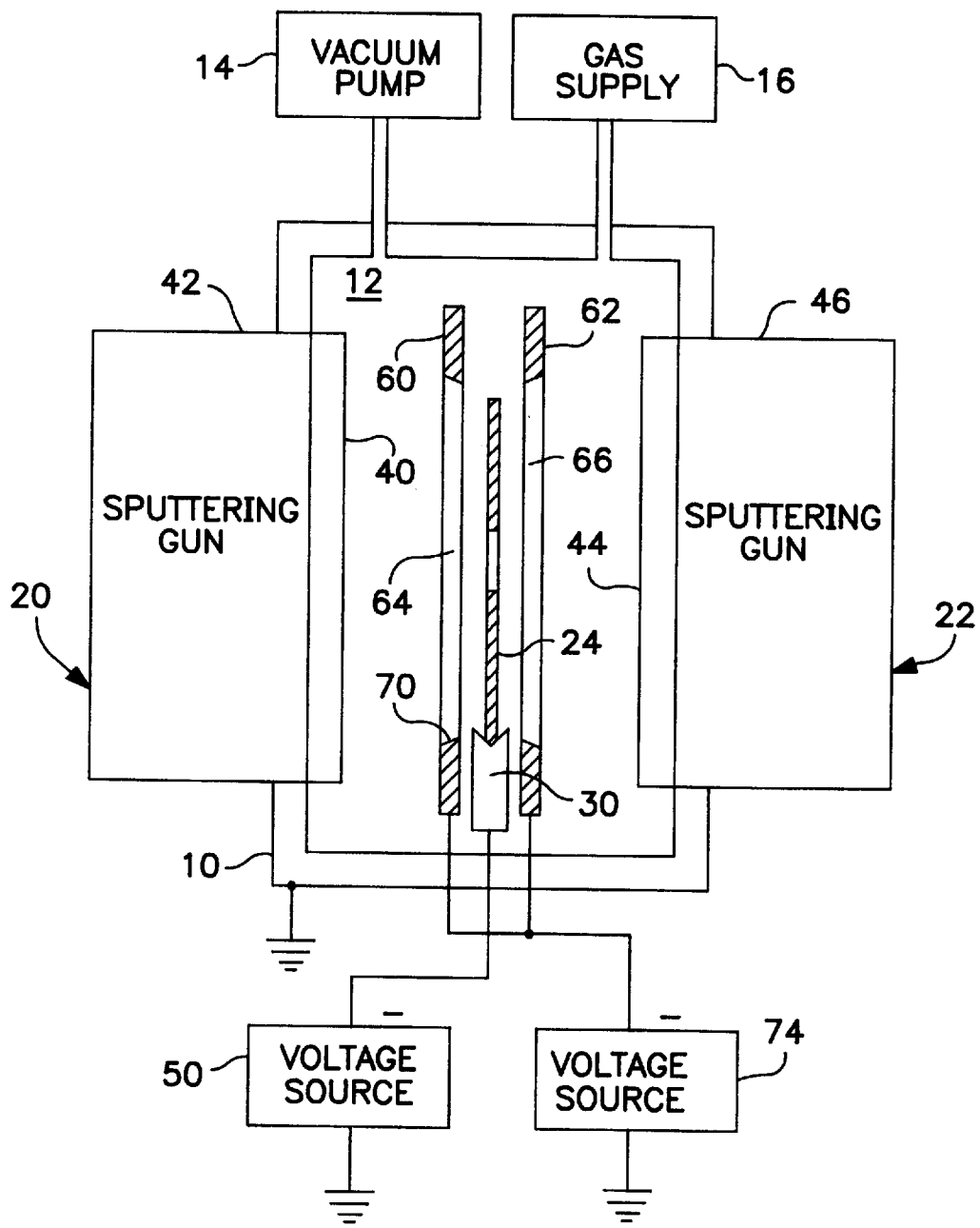
FIG. 1 is a schematic block diagram of an example of sputtering apparatus in accordance with the invention.

A simplified schematic diagram of an example of a sputtering system in accordance with the present invention is shown in FIG. 1. A housing 10 defines an enclosed sputtering chamber 12. The sputtering chamber 12 is connected to a vacuum pump 14 and to a gas supply 16, which control the processing environment within chamber 12. Typically, sputtering is performed in an inert gas, such as argon, at a pressure in a range of about 1 millitorr to 15 millitorr. The sputtering chamber 12 contains one or more gases which form a plasma during processing.

A first sputtering gun 20 and a second sputtering gun 22 are mounted on opposite sides of housing 10. A substrate 24, such as a disk for a hard disk drive, is positioned in sputtering chamber 12 between sputtering guns 20 and 22. Substrate 24 is held in position in sputtering chamber 12 by a substrate holder 30. The substrate holder 30 may move substrate 24 into and out of sputtering chamber 12. Sputtering gun 20 includes a target 40 and a magnet assembly 42. Sputtering gun 22 includes a target 44 and a magnet assembly 46. The targets 40 and 44 are located within sputtering chamber 12 in spaced opposition to opposite surfaces of substrate 24. The magnet assemblies 42 and 46 may be located outside the vacuum envelope of the sputtering chamber 12.

Each magnet assembly produces a magnetic field in a region above the respective target within sputtering chamber 12. The sputtering targets are electrically connected to an RF or a DC negative potential on the order of 300 to 600 volts during operation. A combination of electric field, magnetic field and gas density above the sputtering targets induces a plasma discharge above each sputtering target. The plasma causes sputtering of target atoms, which are deposited onto the surfaces of substrate 24. DC and RF magnetron sputtering techniques are well known to those skilled in the art and are not described in further detail.

In biased sputtering, a negative voltage is applied to substrate 24, typically by the substrate holder 30. As shown in FIG. 1, substrate 24 is connected through substrate holder 30 to a voltage source 50. A negative voltage, typically in a range of up to about 500 volts, is applied to substrate 24 through substrate holder 30. The negative voltage attracts ions in the plasma and causes them to bombard the surfaces of substrate 24. Such bombardment causes desirable modifications to the properties of the films deposited on the surfaces of substrate 24.

The substrate holder 30 typically supports the substrate 24 from below and may be in the form of a blade having a groove for receiving the substrate. This configuration is known as a passive substrate holder. Some configurations of the substrate holder may additionally support the sides of the substrate 24 with clips or other mechanisms and are known as active substrate holders. Various substrate holder configurations are known to those skilled in the art. The electric fields associated with the substrate holder 30 are non-uniform around the periphery of substrate 24.

In accordance with the invention, the sputtering system includes a substrate electrode disposed around the periphery of substrate 24. In the example of FIG. 1, a substrate electrode 60 is positioned adjacent to one surface of substrate 24, and a substrate electrode 62 is positioned adjacent to the opposite surface of substrate 24. Substrate electrodes 60 and 62 have apertures 64 and 66, respectively, that provide a line-of-sight path between each target and the respective surface of substrate 24. In the example described above, the substrate 24 is a circular disk. In this case, the apertures 64 and 66 are circular and have diameters equal to or slightly larger than the diameter of substrate 24. Apertures 64 and 66 may have walls 70 that are tapered inwardly toward substrate 24 to insure a line-of-sight path between each target and the respective surface of substrate 24. Substrate electrodes 60 and 62 are spaced from substrate 24 and substrate holder 30 to permit movement of substrate 24 before and after processing.

The substrate electrodes 60 and 62 are connected to a negative voltage. In the example of FIG. 1, substrate electrodes 60 and 62 are connected to a voltage source 74 which applies a negative voltage, typically up to about 500 volts, to the electrodes 60 and 62. In an alternative configuration, the substrate electrodes 60 and 62 may be connected to voltage source 50, and the voltage source 74 may be omitted. In this case, substrate electrodes 60 and 62 and substrate 24 operate at the same electrical potential.

The substrate electrodes 60 and 62 provide a substantially uniform electrical potential around the periphery of substrate 24, as viewed from the plasma in the regions between each target 40, 44 and the respective surfaces of substrate 24. Preferably, the uniform electrical potentials insure that ions in the plasma are substantially uniformly accelerated toward the surfaces of substrate 24 and substantially uniformly bombard the respective surfaces of substrate 24. As a result, the deposited films have uniform properties over the surfaces of substrate 24. By contrast, in the absence of substrate electrodes 60 and 62, the electrical potential around the periphery of the substrate 24 drops to zero, except where the substrate is contacted by the substrate holder 30. In this case, the bombardment of substrate 24 by gas ions is non-uniform, and the deposited films may be non-uniform. An additional benefit of the substrate electrodes 60 and 62 is that sputtering of the substrate holder 30 is suppressed, and accumulation of deposited material on the substrate holder 30 is reduced.

As described above, the substrate electrodes 60 and 62 preferably provide electrical potentials which ensure substantially uniform ion bombardment of the substrate, so that the deposited film has uniform properties. More generally, the substrate electrodes may provide electrical potentials which precisely control ion bombardment of the substrate, so that the deposited film has a controlled radial distribution of properties. The substrate electrodes, in effect, focus the ions that bombard the substrate. The radial distribution of ions on the substrate is influenced by the voltages applied to the substrate electrodes. The substrate electrode voltage may be greater than, equal to or less than the substrate voltage.

Figure 2:
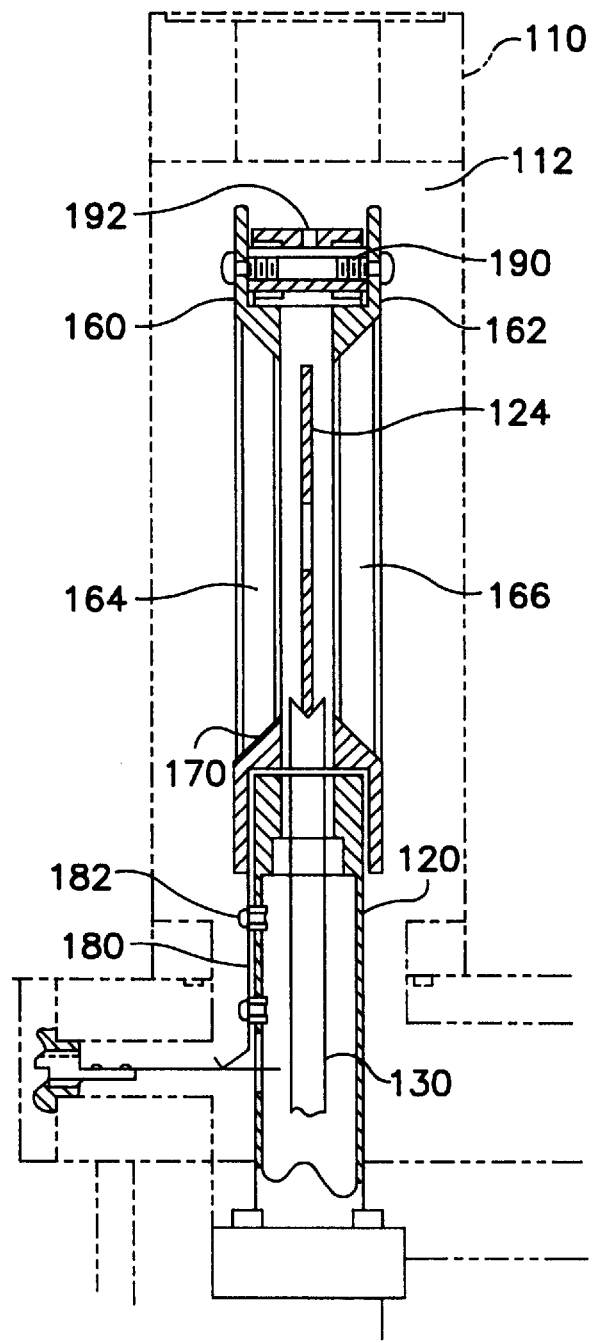
FIG. 2 is a partial cross-sectional view of a first implementation of sputtering apparatus in accordance with the invention.
Figure 3:
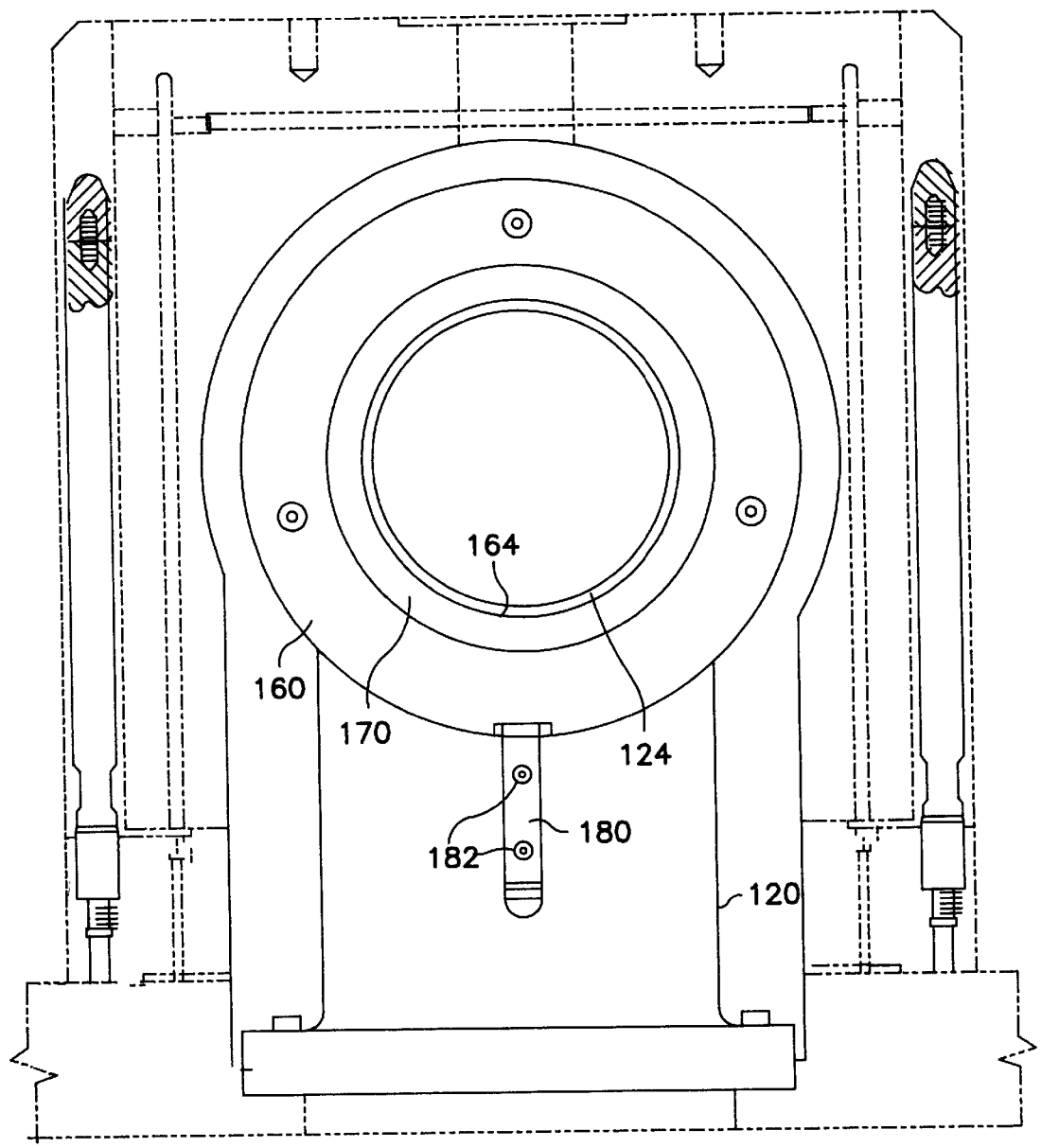
FIG. 3 is a front elevation view of the substrate electrode of FIG. 2.

A first example of an implementation of the sputtering system of FIG. 1 is shown in FIGS. 2 and 3. A housing 110 defines a sputtering chamber 112. A substrate holder 130 positions a substrate 124 within sputtering chamber 112. The sputtering guns are omitted from FIGS. 2 and 3 for simplicity of illustration. The substrate holder 130 moves within a shroud 120. A first substrate electrode 160 and a second substrate electrode 162 are mounted to shroud 120 on opposite sides of substrate 124. Each substrate electrode 160, 162 is fabricated of an electrically conductive material, such as aluminum. The substrate electrodes 160 and 162 have apertures 164 and 166, respectively, with inside diameters that are equal to or slightly larger than the outside diameter of substrate 124. Walls 170 of apertures 164 and 166 may be tapered inwardly toward substrate 124 to insure a line-of-sight path between each sputtering target and the respective surface of substrate 124. Typically, each substrate electrode may be spaced from substrate 124 in a direction perpendicular to the surface of substrate 124 by about 0.25 inch or less. The substrate electrodes 160 and 162 may be electrically connected to a voltage source, as shown in FIG. 1, by a conductive leaf spring 180. The leaf spring 180 is spaced from shroud 120 by insulating fasteners 182. The substrate electrodes 160 and 162 may be electrically connected to each other by a conductive element 190 within an insulating sleeve 192. This configuration insures that the substrate electrodes 160 and 162 are electrically isolated from the shroud 120, which is typically grounded. It will be understood that a variety of different electrical connection configurations may be utilized within the scope of the present invention.

As is apparent in FIG. 3, the inside diameter of aperture 164 is slightly larger than the outside diameter of substrate 124, so that the substrate holder 130 is masked by the substrate electrode 160. Thus, the substrate electrode 160 establishes a substantially uniform electrical potential around the periphery of substrate 124, as viewed from the plasma within the sputtering chamber 112. This configuration insures substantially uniform bombardment of the surface of substrate 124 by ions from the plasma.

Figure 4:
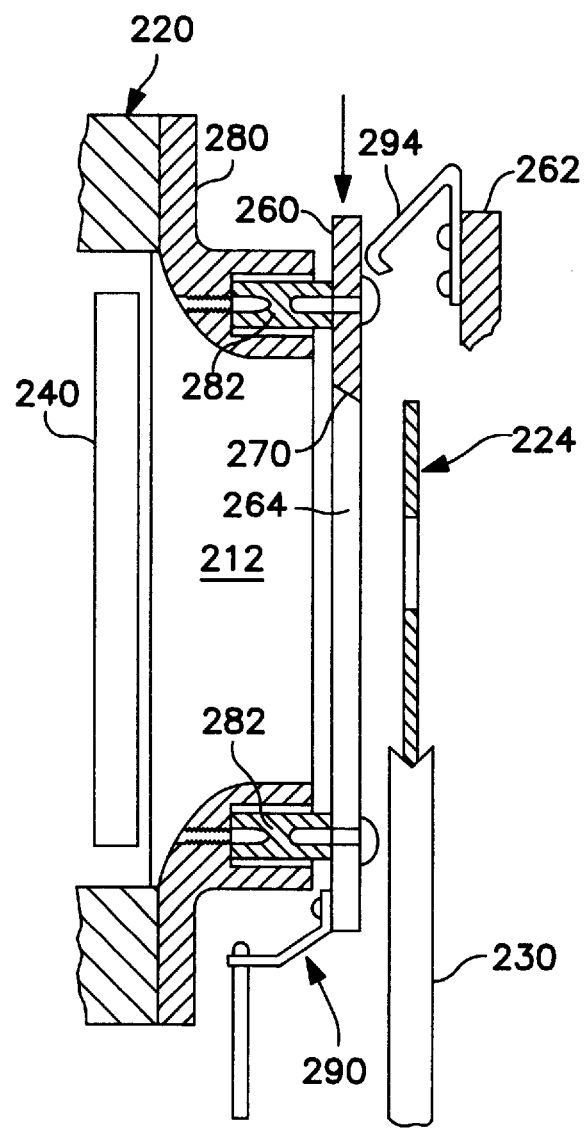
FIG. 4 is a partial schematic view of a second implementation of sputtering apparatus in accordance with the invention.

A second example of an implementation of a sputtering system in accordance with the invention is shown in FIG. 4. A partial cross-sectional view of a sputtering system is shown. A substrate 224 is positioned in a sputtering chamber 212 by a substrate holder 230. A substrate electrode 260 is mounted to a sputtering gun 220 so as to position substrate electrode 260 in proximity to substrate 224. Substrate electrode 260 includes an aperture 264 having an inside diameter that is equal to or slightly larger than the outside diameter of substrate 224. An inside wall 270 of aperture 264 may be tapered inwardly toward substrate 224 to provide a line-of-sight path between substrate 224 and target 240.

Sputtering gun 220 includes a shield 280 that extends into sputtering chamber 212 toward substrate 224. The shield 280 is typically grounded. Substrate electrode 260 may be mounted to shield 280 by insulating standoffs 282 such that substrate electrode 260 is electrically isolated from shield 280. Substrate electrode 260 is electrically connected by a conductor 290 to a negative voltage. As discussed above, the negative voltage applied to the substrate electrode may be the same as or different from the negative voltage applied to substrate 224. The substrate electrode 260 may be electrically connected to a substrate electrode 262 located on the opposite side of substrate 224 by a springtype conductor 294. The substrate electrode 262 may have the same structure and mounting configuration as substrate electrode 260.

The invention has been described above in connection with biased sputtering. However the substrate electrode may be utilized in any substrate processing system wherein the substrate is biased so as to attract charged particles. Examples include DC and RF sputter etching, sputter cleaning, reactive sputtering, chemical vapor deposition and the like. Furthermore, the invention has been described in connection with deposition of films on disks for hard disk drives. However the invention may be applied to different types of substrates, and may be applied to substrates having different shapes and different sizes. In addition, the invention applies to single-sided sputtering, as well as double-sided sputtering, as shown in FIG. 1 and described above. In a single-sided sputtering system, a single sputtering gun deposits a film on one surface of a substrate. In each case, a substrate electrode is positioned in proximity to the substrate and is configured to establish a substantially uniform potential around the periphery of the substrate, as viewed from the plasma within the chamber.

The invention provides a number of advantages in processing of substrates. Substrate holder images (optical, electrical and mechanical material properties) are eliminated in the deposited film. Ion spatial distributions can be made uniform or can be precisely controlled in accordance with deposited film specifications. The substrate electrodes can be mounted in numerous ways. For example, the substrate electrodes can be mounted as a stationary part of the vacuum chamber, can be attached to the substrate holder, or can be attached to the sputtering gun.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for depositing a film on a substrate, comprising:

a housing that encloses a sputtering chamber containing a gas, said gas forming a plasma;

a substrate holder for positioning a substrate in the sputtering chamber and for applying to the substrate an electrical potential for accelerating ions from said plasma toward the substrate;

a first sputtering gun, including a first sputtering target in said chamber, for depositing a film of atoms of said first target on a first surface of the substrate; and a second sputtering gun, including a second sputtering target in said chamber, for depositing a film of atoms of said second target on a second surface of the substrate; and a substrate electrode assembly comprising a first electrode disposed in proximity to the first surface of the substrate and a second substrate electrode disposed in proximity to the second surface of the electrode for controlling trajectories of ions accelerated from said plasma toward the two surfaces of the substrate, said substrate electrode assembly permitting movement of the substrate by the substrate holder and establishing a substantially uniform electrical potential around the periphery of the substrate as viewed from said plasma.

2. Apparatus as defined in claim 1 wherein said first and second sputtering guns, each comprise magnetrons.

3. Apparatus as defined in claim 2 wherein said first and second substrate electrodes each include an aperture that is equal to or larger than the substrate, wherein the substrate is exposed to the first and second targets through the respective apertures.

4. Apparatus as defined in claim 2 wherein said circular aperature have slightly larger diameters than the substrate.

5. Apparatus as defined in claim 3 wherein the substrate comprises a circular disk and wherein the apertures in said first and second substrate electrodes are circular.

6. Apparatus as defined in claim 2 wherein said substrate electrodes are configured to mask said substrate holder during sputtering.

7. Apparatus as defined in claim 4 wherein said aperture has an inside surface that is tapered inwardly toward the substrate to provide a line-of-sight path between said targets and the substrate.

8. Apparatus as defined in claim 2 wherein said substrate electrodes are positioned in said sputtering chamber so as to provide a line-of-sight path between said targets and the substrate, while establishing a uniform electrical potential around the periphery of the substrate.

9. Apparatus as defined in claim 2 wherein said first and second substrate electrodes are biased such that ions substantially uniformly bombard the first and second surfaces of the substrate.

10. Apparatus as defined in claim 2 wherein said substrate holder and said substrate electrode assembly are connected to a voltage source.

11. Apparatus as defined in claim 1 wherein said substrate holder and said substrate electrode assembly are connected to first and second voltage sources, respectively.

12. Apparatus as defined in claim 1 wherein said substrate holder and said first and second substrate electrodes are connected to a negative voltage source.

13. Apparatus as defined in claim 1 wherein said substrate holder is connected to a first negative voltage source and wherein said first and second substrate electrodes are connected to a second negative voltage source.

14. A method for depositing a film on a substrate, comprising the steps of:

positioning a substrate in a sputtering chamber containing a gas, said gas forming a plasma;

applying to the substrate an electrical potential for accelerating ions from said plasma toward the substrate;

depositing on the opposite surfaces of the substrate a uniform film of atoms from targets positioned relative to a substrate surface in the sputtering chamber; and controlling trajectories of ions accelerated from said plasma toward the substrate with a substrate electrode assembly, said substrate electrode assembly comprising electrode being positioned closely spaced to each surface of a substrate while permitting movement of the substrate and establishing a substantially uniform electrical potential around the periphery of the substrate by applying a bias potential to said electrode assembly as viewed from the substrate.

15. A method as defined in claim 14 wherein said substrate electrode is biased such that ions substantially uniformly bombard the surfaces of the substrate.

* * * * *

UNITED STATES PATENT AND TRADEMARK OFFICE
CERTIFICATE OF CORRECTION

PATENT NO.   : 5,891,311
DATED        : April 6, 1999
INVENTOR(S)  : Lewis, W. A. et al.

It is certified that error appears in the above-indentified patent and that said Letters Patent is hereby corrected as shown below:

```
Column 7, line 52, the first line of claim 4,
         change "claim 2" to -- claim 5 --.
Column 7, line 53, the second line of claim 4,
         change "aperature have slightly larger"
         to -- aperatures have larger -- .
Column 8, lines 7 and 8, change "aperature has"
         to -- aperatures have -- .
Column 8, line 45, change "electrode being
         positioned" to -- electrodes being
         positioned --.
```

Signed and Sealed this

Twenty-eighth Day of December, 1999

Attest:

Q. TODD DICKINSON

Attesting Officer

Acting Commissioner of Patents and Trademarks